(12) United States Patent
Levinski et al.

(10) Patent No.: US 9,864,209 B2
(45) Date of Patent: Jan. 9, 2018

(54) SELF-MOIRE TARGET DESIGN PRINCIPLES FOR MEASURING UNRESOLVED DEVICE-LIKE PITCHES

(71) Applicant: KLA-Tencor Corporation, Milpitas, CA (US)

(72) Inventors: Vladimir Levinski, Migdal HaEmek (IL); Yuri Paskover, Caesarea (IL); Daniel Kandel, Aseret (IL)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/112,819

(22) PCT Filed: May 19, 2016

(86) PCT No.: PCT/US2016/033323
§ 371 (c)(1),
(2) Date: Jul. 20, 2016

(87) PCT Pub. No.: WO2016/187453
PCT Pub. Date: Nov. 24, 2016

(65) Prior Publication Data
US 2017/0146810 A1    May 25, 2017

Related U.S. Application Data

(60) Provisional application No. 62/163,764, filed on May 19, 2015.

(51) Int. Cl.
G02B 27/60 (2006.01)
G01B 11/25 (2006.01)
G01B 11/02 (2006.01)

(52) U.S. Cl.
CPC .............. G02B 27/60 (2013.01); G01B 11/02 (2013.01); G01B 11/25 (2013.01)

(58) Field of Classification Search
CPC .......... G02B 27/60; G01B 11/02; G01B 11/25
See application file for complete search history.

(56) References Cited

U.S. PATENT DOCUMENTS

| | | | | |
|---|---|---|---|---|
| 4,326,147 A | * | 4/1982 | Nakayama | H01J 29/076 313/403 |
| 6,351,307 B1 | * | 2/2002 | Erskine | G01J 3/2823 356/451 |

(Continued)

FOREIGN PATENT DOCUMENTS

WO    2014074873    5/2014

OTHER PUBLICATIONS

Ausschnitt, From compliance to control: off-roadmap metrology for low-k1 lithography, Proceedings of SPIE, vol. 4344, p. 1-11 Feb. 25, 2001.

*Primary Examiner* — Sang Nguyen
(74) *Attorney, Agent, or Firm* — Hodgson Russ LLP (57) ABSTRACT

Metrology targets and methods are provided, which provide self-Moiré measurements of unresolved target features, i.e., interaction of electromagnetic fields re-scattered off elements within a single target layer provides signals with Moiré pitches that are measurable, although the actual target pitches are unresolved and possibly device-like. Targets comprise cell(s) with interlaced lines of elements having different device-like pitches which are selected to yield resolved Moiré pitch(es). Different target designs are presented for scatterometry and imaging metrology measurements, as well as for critical dimension, dose and focus, and pitch walk measurements—of device-like targets.

16 Claims, 7 Drawing Sheets

(56) References Cited

U.S. PATENT DOCUMENTS

| | | | |
|---|---|---|---|
| 7,440,105 B2 | 10/2008 | Adel et al. | |
| 8,922,786 B2* | 12/2014 | Iwai | G01D 5/38 356/499 |
| 2002/0016629 A1* | 2/2002 | Sandstedt | A61B 3/1015 623/6.11 |
| 2004/0246482 A1 | 12/2004 | Sezginer et al. | |
| 2005/0123844 A1 | 6/2005 | Monshouwer | |
| 2005/0275724 A1* | 12/2005 | Albertelli | H04N 1/00002 348/187 |
| 2006/0250597 A1 | 11/2006 | Nakajima | |
| 2012/0133938 A1* | 5/2012 | Deckers | G03F 7/70483 356/388 |
| 2014/0139815 A1 | 5/2014 | Amir | |
| 2015/0198524 A1* | 7/2015 | Sapiens | G02B 27/56 356/445 |

\* cited by examiner

SELF-MOIRE TARGET DESIGN PRINCIPLES FOR MEASURING UNRESOLVED DEVICE-LIKE PITCHES

CROSS REFERENCE TO RELATED APPLICATIONS

This application claims the benefit of U.S. Provisional patent application Ser. No. 62/163,764 filed on May 19, 2015, which is incorporated herein by reference in its entirety.

BACKGROUND OF THE INVENTION

1. Technical Field

The present invention relates to the field of metrology, and more particularly, to target designs for measuring unresolved device-like pitches.

2. Discussion of Related Art

On-device overlay (OVL) metrology is challenging as the design rule pitches are unresolved by modern optical tools (both imaging and SCOL—scatterometry overlay tools). Instead, OVL measurement is performed on specially designed "proxy" targets, having typical scales (pitches) of hundreds of nanometers and the gap between device pitch (<90 nm) and the "proxy" target pitch is constantly growing. Since all processing steps are optimized to device scales the "proxy" targets are not fully process compatible which results in various types of target asymmetries appearing in OVL targets.

Using the Moiré principle enables resolving small pitches, as the resolved pitch resulting from mutual re-scattering of diffraction orders between gratings with small unresolvable but close pitches is $$P = \frac{p_1 \cdot p_2}{p_1 - p_2},$$

so that choosing $$p_1 - p_2 \ll \frac{p_1 + p_2}{2}$$

one can get $$P \gg \frac{p_1 + p_2}{2}$$

as the resolved pitch which relates to the unresolved pitches $p_1, p_2$.

U.S. Pat. No. 7,440,105 as well as Ausschnitt 2001 ("From compliance to control: off-roadmap metrology for low-kJ. Lithography", Metrology, Inspection, and Process Control for Microlithography XV, Neal T. Sullivan, Editor, Proceedings of SPIE Vol. 4344), which are incorporated herein by reference in their entirety, suggest using Moiré patterns from one-dimensional gratings (grating over grating side by side), however, low re-scattering efficiency and gratings removed from each other at more than the decay distance (diffraction orders corresponding to device-like pitches are strongly evanescent with decay length≤100 nm) limit the applications.

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a metrology target comprising at least one cell comprising interlaced lines of elements, the interlaced lines having at least two different device-like pitches, $p_1$ and $p_2$, selected to yield at least one resolved Moiré pitch $p=p_1 \cdot p_2/(p_1-p_2)$, with $p_1, p_2 \leq 100$ nm and $p>400$ nm.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIGS. 1-7 are high level schematic illustrations of a range of target designs utilizing the self-Moiré principle, according to some embodiments of the invention.

DETAILED DESCRIPTION OF THE INVENTION

Prior to the detailed description being set forth, it may be helpful to set forth definitions of certain terms that will be used hereinafter.

The term's "metrology target" or "target" as used herein in this application, are defined as any structure designed or produced on a wafer which is used for metrological purposes. The term "target element" or "element" as used herein in this application is defined as a target part with a defined shape, e.g., a rectangle such as a bar or a trench. Targets comprise periodic structures, having elements repeating at one or more pitches, such as gratings. The term "periodic structure" as used herein in this application is defined as a plurality of target elements configured at a recurring pattern. Two dimensional periodic structures comprise elements in a two-dimensional pattern. The term "line" as used herein in this application is defined as a one dimensional periodic structure which is part of the two dimensional structure. The term "interlacing" as used herein in this application with reference to lines is defined as using lines of different periodic structures in an alternating (not necessarily regular) manner.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein is for the purpose of description and should not be regarded as limiting.

Disclosed target designs utilize a self-Moiré principle applied to elements of two-dimensional target structures within the same layer or very close layers to significantly increase the re-scattering efficiency and provide measurable signals. The disclosed target designs generate propagating signals even with unresolved target pitches, to improve the accuracy of OVL measurements and enable measurement of device pitches in the targets.

Metrology targets and methods are provided, which provide self-Moiré measurements of unresolved target features, i.e., interaction of electromagnetic fields re-scattered off elements within a single target layer provides signals with Moiré pitches that are measurable, although the actual target pitches are unresolved and possibly device-like. Targets comprise cell(s) with interlaced lines of elements having different device-like pitches which are selected to yield resolved Moiré pitch(es). Different target designs are presented for scatterometry and imaging metrology measurements, as well as for critical dimension, dose and focus, and pitch walk measurements—of device-like targets.

Figure 1:
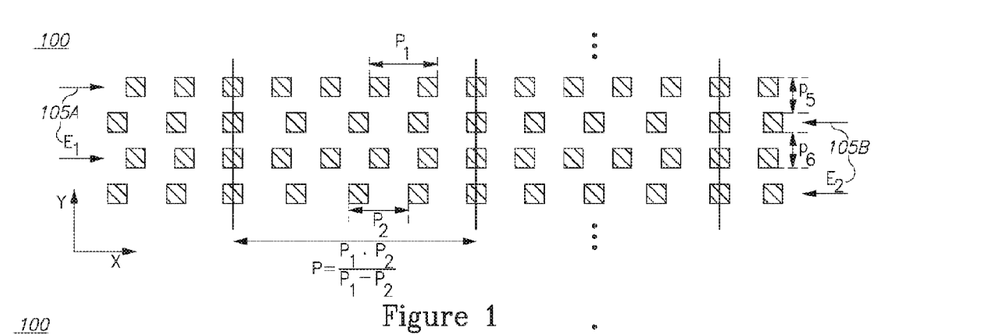
FIG. 1 is a high level schematic illustration of self-Moiré metrology targets, according to some embodiments of the invention.

FIGS. 1-6 are high level schematic illustrations of a range of target designs 100 utilizing the self-Moiré principle, according to some embodiments of the invention. In FIG. 1, metrology target 100 comprising at least one cell comprising interlaced lines of elements 105A ($E_1$ for the corresponding electromagnetic field) and 105B ($E_2$ for the corresponding electromagnetic field) which have at least two different device-like pitches, $p_1$ and $p_2$, selected to yield at least one resolved Moiré pitch $p=p_1 \cdot p_2/(p_1-p_2)$, with $p_1, p_2 \leq 100$ nm and $p>400$ nm as a non-limiting example. The pitches $p_1, p_2$ are selected to be close to each other, unresolved by the optical tool and strongly evanescent. The gaps between gratings with different pitches, denoted by $p_5$, $p_6$, may be selected according to printability considerations and the reduction of their size may be used to enhance the effectiveness of generation the Moiré pitch p. In the illustrated not limiting example, lines with different pitches alternate regularly and are interlaced at a 1:1 ratio. It is noted that since the generated first diffraction orders corresponding to small pitches $p_1$ and $p_2$ are evanescent, the effective length of their interaction is about the values of these pitches. Accordingly, pitches $p_5$ and $p_6$ may be designs to be similar or smaller than $p_1$ and $p_2$. Designing alternating lines 105A, 105B, though not limiting, provides effective interaction between the gratings to make the whole target area contribute to the generation of the Moiré pitch.

In the illustrated case of FIG. 1, scattering on first and second periodic structures 105A, 105B, respectively provide the electromagnetic fields expressed in Equations 1, and the result of their double scattering, which is the product of the fields $E_1 \cdot E_2$ is provided in Equation 2, with only diffraction orders shown which propagate through the optical tool and are hence resolved, namely for which $$1/p = \frac{\text{abs}(p_1 - p_2)}{p_1 p_2} < \frac{2NA}{\lambda}.$$

$$E_1 = \text{const}_1 + a_1 \cdot e^{i\frac{2\pi}{p_1}x} + a_{-1} \cdot e^{-i\frac{2\pi}{p_1}x} + \ldots \quad \text{Equations 1}$$
$$E_2 = \text{const}_2 + b_1 \cdot e^{i\frac{2\pi}{p_2}x} + b_{-1} \cdot e^{-i\frac{2\pi}{p_2}x} + \ldots$$

$$E_1 \cdot E_2 = \left(\text{const}_1 + a_1 \cdot e^{i\frac{2\pi}{p_1}x} + a_{-1} \cdot e^{-i\frac{2\pi}{p_1}x} + \ldots\right) \cdot \quad \text{Equation 2}$$
$$(\text{const}_2 + b_1 \cdot e^{i\frac{2\pi}{p_2}x} + b_{-1} \cdot e^{-i\frac{2\pi}{p_2}x} + \ldots =$$
$$\ldots + c_1 \cdot e^{i\frac{2\pi(p_1-p_2)}{p_1 p_2}x} + c_{-1} \cdot e^{-i\frac{2\pi(p_1-p_2)}{p_1 p_2}x} + \ldots$$

Figure 2:
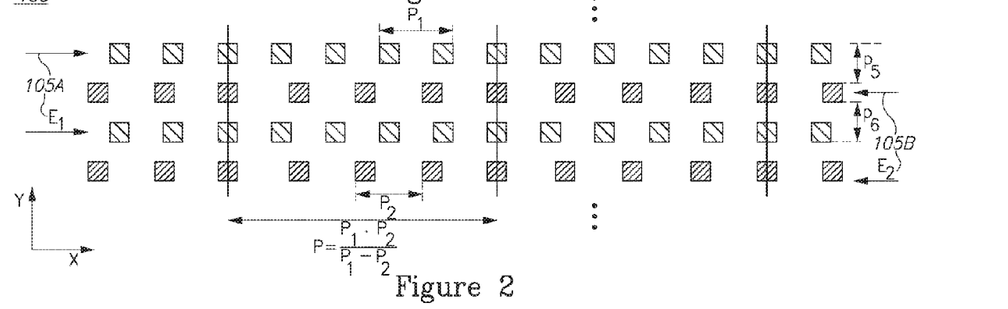
FIG. 2 is a high level schematic illustration of sequentially produced self-Moiré metrology targets, according to some embodiments of the invention.

Therefore, p is resolved and provides overlay information concerning unresolved pitches $p_1, p_2$. FIG. 2 schematically illustrates, according to some embodiments of the invention, a case with interlaced lines 105A, 105B being produced sequentially, specifically, with second periodic structure 105B being produced after first periodic structure 105A, as typical for double patterning metrology. Once second periodic structure 105B is produced, measurement of Moiré pitch p may be carried out according to Equation 2.

Figure 3:
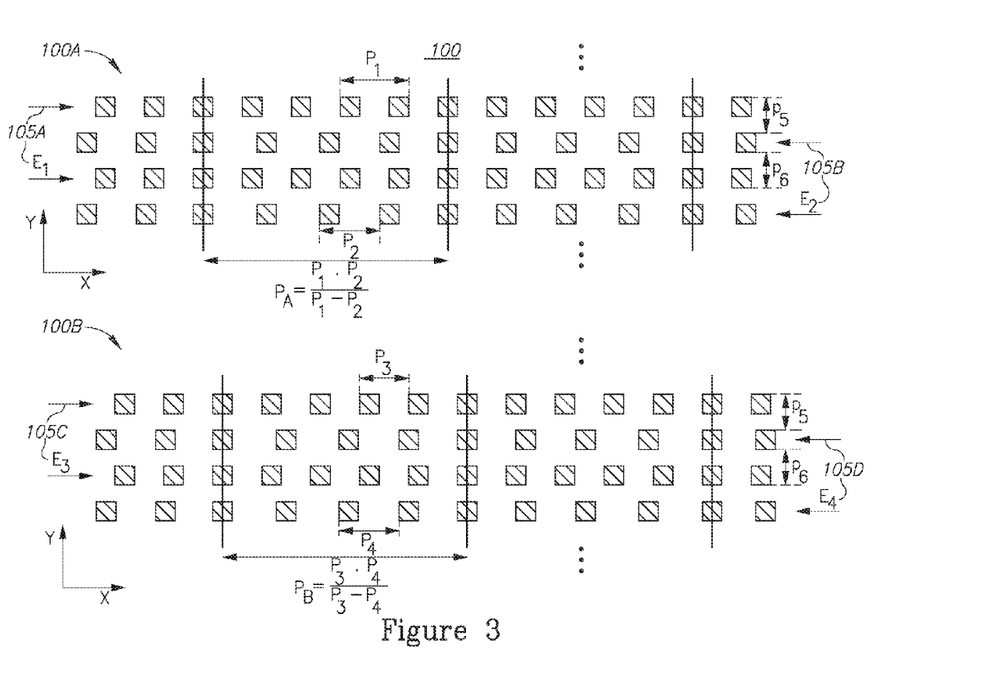
FIG. 3 is a high level schematic illustration of two-layered self-Moiré metrology targets, according to some embodiments of the invention.

FIG. 3 schematically illustrates, according to some embodiments of the invention, metrology target 100 comprising at least two layers 100A, 100B one above another, having respectively $p_1$, $p_2 \leq 100$ nm, $p_A = p_1 \cdot p_2/(p_1-p_2) > 400$ nm and $p_3$, $p_4 \leq 100$ nm, $p_B = p_3 \cdot p_4/(p_3-p_4) > 400$ nm, with $p_A = p_B$, useful e.g., for scatterometry OVL tools (first order scatterometry, μDBO approach) which are based on measurement of grating over grating targets. For technologies utilizing optical crosstalk between layers, there is a requirement that solely propagating orders generated at one layer could be re-scattered at the other. In order to avoid mutual re-scattered of evanescent diffraction orders, even for closely placed layers, the conditions expressed in Equations 3 should be fulfilled. $P_1$, $P_2$ denote the pitches of periodic structures 105A, 105B, respectively, in layer 100A, and $P_3$, $P_4$ denote the pitches of periodic structures 105C, 105D, respectively, in layer 100B. Λ denotes the pitch corresponding to the highest spatial frequency collected by the optical system.

$$\frac{P_1 P_2}{P_1 - P_2} = \frac{P_3 P_4}{P_3 - P_4}; \frac{P_1 P_3}{P_1 - P_3} < \Lambda; \frac{P_1 P_4}{P_4 - P_1} < \Lambda; \quad \text{Equation 3}$$
$$\frac{P_2 P_3}{P_2 - P_3} < \Lambda; \frac{P_2 P_4}{P_2 - P_4} < \Lambda$$

For example, the following values exemplify in a non-limiting manner an appropriate value selection, satisfying Equations 3: $p_1$=80 nm, $p_2$=90 nm, $P_A$=720 nm; $p_3$=180 nm, $p_4$=240 nm and $P_B$=720 nm. In this case $$\frac{P_1 P_3}{P_1 - P_3} = 144 \text{ nm}, \frac{P_1 P_4}{P_1 - P_4} = 120 \text{ nm}, \frac{P_2 P_3}{P_2 - P_3} = 180 \text{ nm and}$$
$$\frac{P_2 P_4}{P_2 - P_4} = 144 \text{ nm}.$$

Correspondingly, Λ=180 nm is a non-propagating pitch. Other examples may be designed according to the required disclosed requirements.

It is noted that $P_{1...4}$ may represent projections of the pitches on an axis of choice, as explained below concerning FIG. 4.

Figure 4:
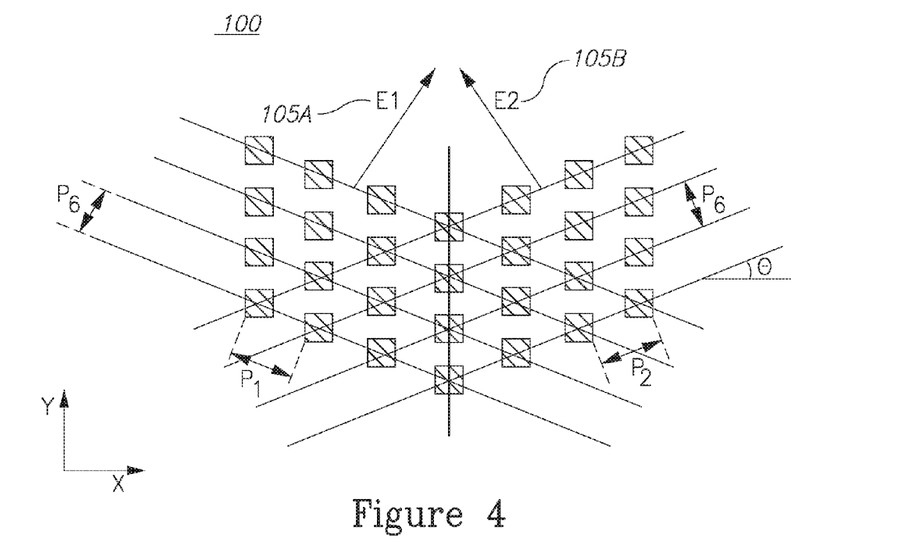
FIG. 4 is a high level schematic illustration of self-Moiré metrology targets with tilted periodic structures, according to some embodiments of the invention.

FIG. 4 illustrates schematically an example of tilted periodic structures 105A, 105B, according to some embodiments of the invention. In the illustration, the target elements have the same unresolved pitch $p_1$=$p_2$ and the separation between the lines $p_6$ is $p_6$=$p_1$*sin(2θ). Equations 4 express the electromagnetic fields and Equation 5 provides the product of the fields $E_1 \cdot E_2$ which is the result of their double scattering, with only diffraction orders shown which propagate through the optical tool and are hence resolved, namely for which sin $$\theta < NA \frac{p}{\lambda}, \text{ with } p = p_1 = p_2.$$

$$E_1 = \quad \text{Equations 4}$$
$$\text{const}_1 + a_1 \cdot e^{i\frac{2\pi}{p}(x\cdot\cos\theta + y\cdot\sin\theta)} + a_{-1} \cdot e^{-i\frac{2\pi}{p}(x\cdot\cos\theta + y\cdot\sin\theta)} + \ldots$$
$$E_2 = \text{const}_2 + b_1 \cdot e^{i\frac{2\pi}{p}(x\cdot\cos\theta + y\cdot\sin\theta)} + b_{-1} \cdot e^{-i\frac{2\pi}{p}(x\cdot\cos\theta + y\cdot\sin\theta)} + \ldots$$

$$E_1 \cdot E_2 = \quad \text{Equation 5}$$
$$\left(\text{const}_1 + a_1 \cdot e^{i\frac{2\pi}{p}(x\cdot\cos\theta + y\cdot\sin\theta)} + a_{-1} \cdot e^{-i\frac{2\pi}{p}(x\cdot\cos\theta + y\cdot\sin\theta)} + \ldots\right) \cdot$$
$$\left(\text{const}_2 + b_1 \cdot e^{i\frac{2\pi}{p}(x\cdot\cos\theta + y\cdot\sin\theta)} + b_{-1} \cdot e^{-i\frac{2\pi}{p}(x\cdot\cos\theta + y\cdot\sin\theta)} + \ldots\right) == \ldots + c_1 \cdot e^{i\frac{4\pi\sin\theta}{p} y} + c_{-1} \cdot e^{-i\frac{4\pi\sin\theta}{p} y} + \ldots$$

Generally, target designs having coexisting two-dimensional patterns 105A, 105B of unresolved features are provided, in which patterns 105A, 105B are configured to have their projections of the lattice vectors, normalized by illumination wavelength and along a specified axis X—differ by less than highest spatial frequency resolvable by optical system. Mutually re-scattered orders may be used to monitor the relative position and configuration of patterns 105A, 105B of unresolved features by detecting them in the pupil of the optical metrology tool and/or by observing interference signals between the re-scattered orders in any other optical plane, e.g., in field conjugate plane.

Imaging OVL tools (e.g., using the standard imaging scheme, two-beam imaging with zero order blocking, etc.) are based on measurement of side by side targets. In this case there is no re-scattering between two layers and the only limitation is for the value of Moiré pitch to be propagating through the optical system. This condition is satisfied when $$\frac{\text{abs}(p_1 - p_2)}{p_1 p_2} < \frac{NA_C + NA_{IL}}{\lambda}$$

for the type of target design illustrated schematically in FIG. 1, and sin $$\theta < \frac{NA_C + NA_{IL}}{2} \frac{p}{\lambda}$$

for the type of target design illustrated schematically in FIG. 4, with $NA_C$ denoting the collection NA, and $NA_{IL}$ denoting the illumination NA—for the first diffraction orders to be captured by a lens to provide an image.

Targets of different types (as in FIGS. 1 and 4) may also be used to prevent re-scattering of evanescent modes from different target layers. It is also noted that target layers of the type illustrated in FIG. 4 may be used in multi-layered scatterometry targets as described above in FIG. 3. Moreover, combinations of standard target layer designs with propagating pitch P and self-Moiré target layers with the same Moiré pitch P may be used to control the re-scattering of evanescent modes between target layers and to provide additional overlay measurements.

Since the target asymmetry used to indicate the scanner focus position is measured with a first order scatterometry tool, it requires pitches >500 nm which are far larger from the design rule pitches. Accordingly, other scanner aberrations provide significant contribution to the inaccuracy of scanner focus position measurement. Disclosed targets 100 utilizing the self-Moiré principle therefore enable a more accurate measurement of the scanner focus position as well, because all scanners provide the same effect of aberration as for the devices with the same pitch.

Figure 5:
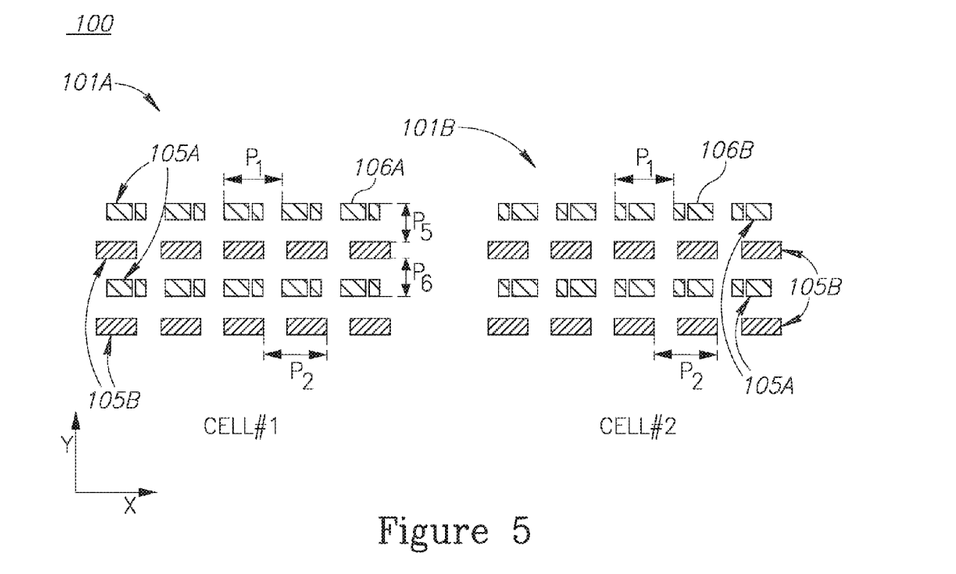
FIG. 5 is a high level schematic illustration of imaging self-Moiré metrology targets for focus and dose measurements, according to some embodiments of the invention.

Scanner focus position may also be measured using an imaging tool, utilizing self-Moiré targets 100 with cell pair(s) having inverse asymmetry as illustrated in the following. FIG. 5 is a high level schematic illustration of imaging target 100 for focus and dose measurements, according to some embodiments of the invention. Metrology target 100 may comprise at least two of cells 101A, 101B, side by side, having both $p_1$, $P_2 \leq 100$ nm, $p_A = p_1 \cdot p_2/(p_1 - p_2)$ >400 nm, wherein at least some of the elements are mirrored in one of the cells with respect to the other of the cells, e.g., elements 106A of pattern 105A in cell 101A are mirrored with respect to elements 106B of pattern 105B in cell 101B. The OVL between cells 101A, 101B may be measured by a standard OVL measurement procedure. The effect of scanner asymmetric aberrations is the same as for real devices.

Certain embodiments comprise self-Moiré target designs 100 for first order scatterometry CD (critical dimension)

measurement, which are enabled as the propagating orders bring information on design rule pitches. Yet another application of disclosed self-Moiré target designs 100 is pitch walk measurement. Pitch walk is an error in positioning a second periodic structure with respect to a first periodic structure in double patterning. Pitch walk typically yields diffraction orders that correspond to the double pitch but are still <200 nm and unresolved. Both applications are enabled as using the self-Moiré principle provides at least partial information from unresolved pitches.

Figure 6:
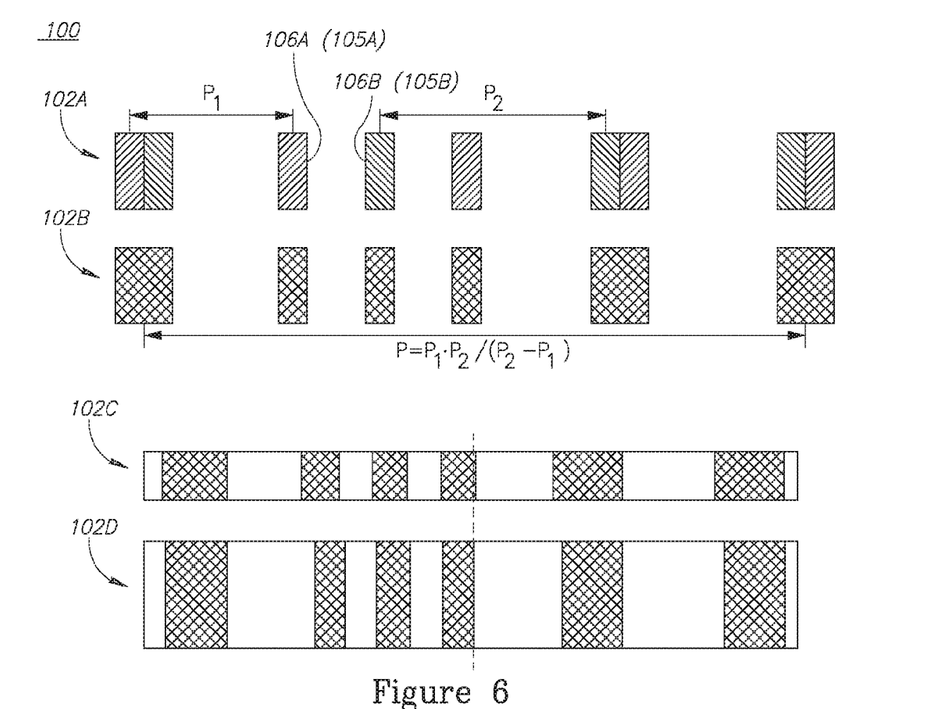
FIG. 6 is a high level schematic illustration of one-dimensional self-Moiré target designs, according to some embodiments of the invention.

FIG. 6 is a high level schematic illustration of one-dimensional self-Moiré target designs 100, according to some embodiments of the invention. Targets 100 comprise interlaced lines 105A, 105B designed to yield a single compound line 102B to provide one-dimensional self-Moiré target 100. In design 102A, periodic structures 105A, 105B (with respective elements 106A, 106B) are designed with pitches $P_1$ and $P_2$ selected to provide a coarse (Moiré) pitch $P=P_1 \cdot P_2/(P_2-P_1)$. The final target design 102B combines both pitches into a unitary structure, so that the distribution of the printed lines (interlaced target elements) within the coarse pitch contains two different periods ($P_1$, $P_2$). The open gaps between lines are smaller than the value of the smallest pitch (in this case $P_1$). The diffraction efficiency of the coarse pitch is enhanced by a double scattering effect since the diffraction efficiencies of each one of the small pitches $P_1$ and $P_2$ are strong within the grating layer. Corresponding mask design 102C and printed target 102D are like-wise shown. One-dimensional self-Moiré targets 100 may be used in any of the other designs disclosed herein.

Figure 7:
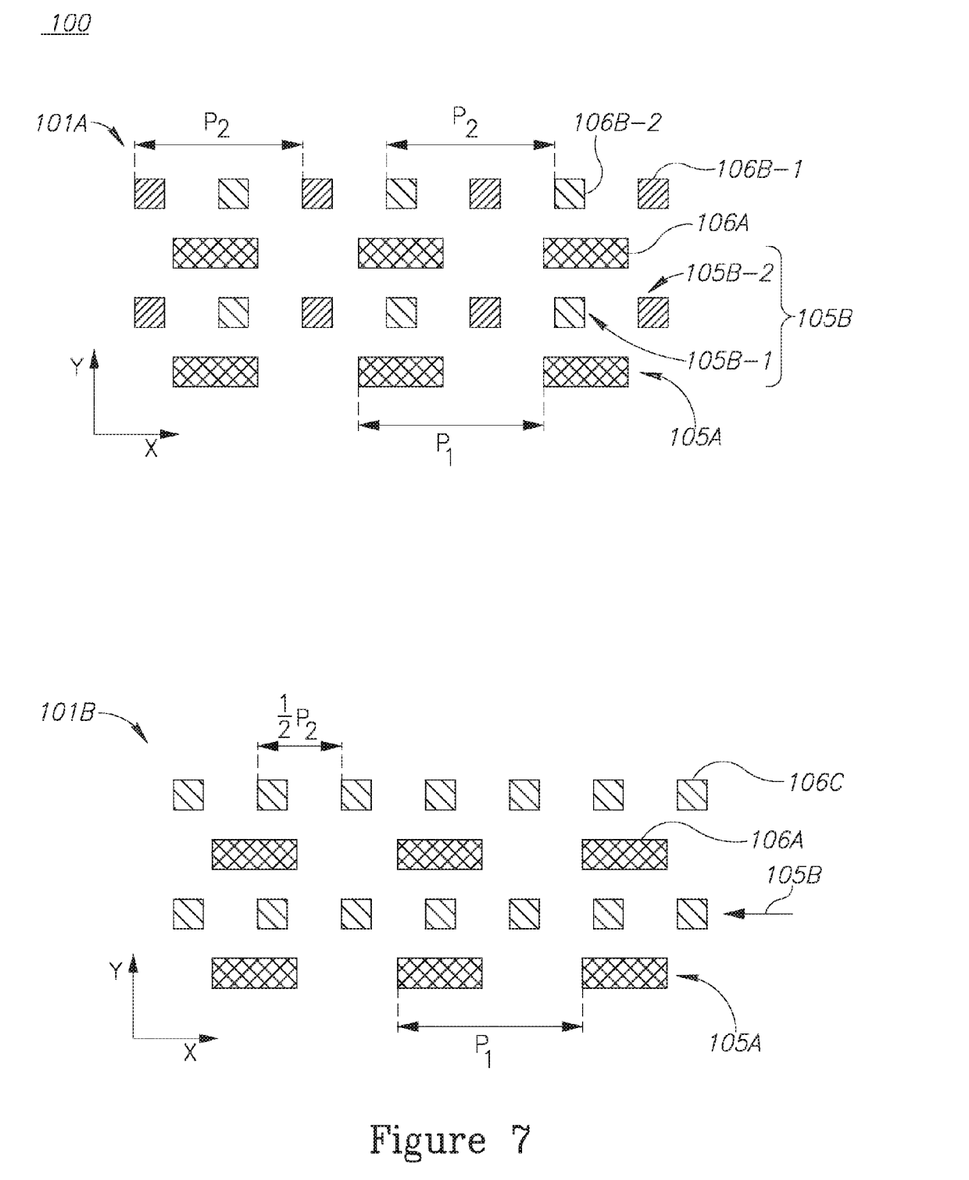
FIG. 7 is a high level schematic illustration of self-Moiré target designs for pitch walk measurements, according to some embodiments of the invention.

FIG. 7 is a high level schematic illustration of target 100 for pitch walk measurements, according to some embodiments of the invention. Metrology target 100 comprises at least two cells 101A, 101B, having both $p_1$, $p_2 \leq 100$ nm, $p_A = p_1 \cdot p_2/(p_1-p_2) > 400$ nm. In cell 101A, interlaced line 105B comprises elements 106B-1 and 106B-2 which are produced in consecutive steps as interlaced periodic structures 105B-1 and 105B-2, respectively. For example, target 100 may be used to measure pitch walk in double patterning. Patterns 105A and 105B-1 in cell 101A may be printed simultaneously with slightly different pitches $p_1$, $p_2$, respectively, while pattern 105B-2 may be printed at a later second step of the double patterning, with pitch $p_2$. Pitch walk generates re-scattering resulting in propagating a Moiré diffraction order with the information about the pitch walk shift patterns 105B-1 and 105B-2, which can be measured by an OVL tool with respect to similar cell 101B (with pattern 105B being the sum of patterns 105B-1 and 105B-2) which is fully produced during the first step.

Certain embodiments comprise target design files of target 100 and/or corresponding metrology measurements target 100. The metrology measurements provide information on unresolved device-like target pitches.

Figure 8:
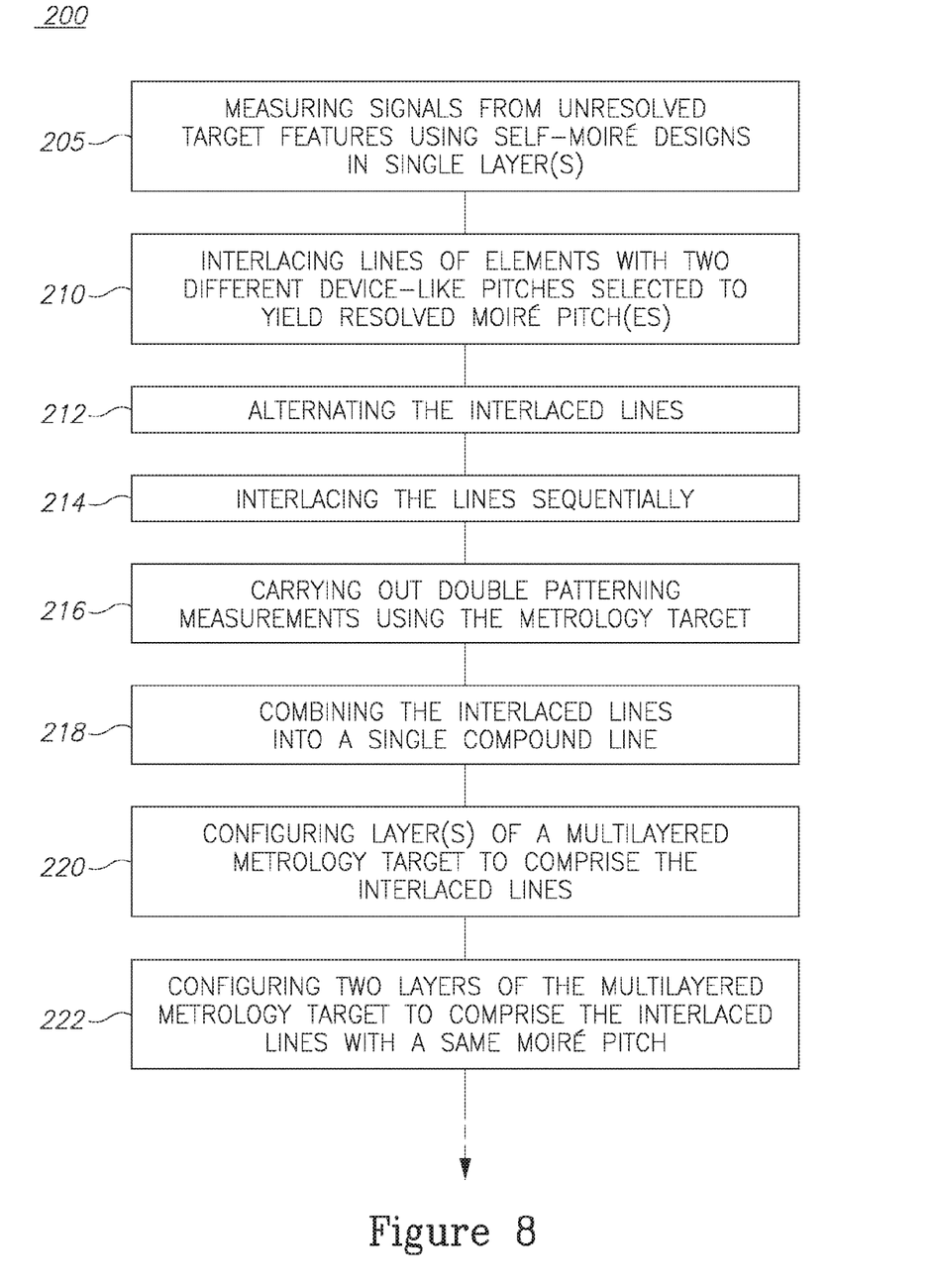
FIG. 8 is a high level flowchart illustrating a method, according to some embodiments of the invention.

FIG. 8 is a high level flowchart illustrating a method 200, according to some embodiments of the invention. The method stages may be carried out with respect to targets 100 described above, which may optionally be configured by method 200. Method 200 may be at least partially implemented by at least one computer processor, e.g., in a metrology module. Certain embodiments comprise computer program products comprising a computer readable storage medium having computer readable program embodied therewith and configured to carry out of the relevant stages of method 200. Certain embodiments comprise target design files of respective targets designed by embodiments of method 200.

Method 200 enables measuring signals from unresolved target features using self-Moiré designs in single layer(s) (stage 205) and comprises producing and measuring the metrology targets (stage 260).

Method 200 comprises interlacing lines of elements to produce a metrology target, the interlaced lines having at least two different device-like pitches, $p_1$ and $p_2$, selected to yield at least one resolved Moiré pitch $p=p_1 \cdot p_2/(p_1-p_2)$, with $p_1$, $p_2 \leq 100$ nm and $p>400$ nm (stage 210). For example, method 200 may comprise alternating the interlaced lines (stage 212).

Method 200 may comprise producing the interlaced lines sequentially (stage 214) and carrying out double patterning measurements using the metrology target (stage 216). In certain embodiments, method 200 comprises combining the interlaced lines into a single compound line (stage 218) to provide one dimensional self-Moiré targets which may be used in any of the other designs disclosed herein.

Method 200 may comprise configuring at least one layer of a multilayered metrology target to comprise the interlaced lines (stage 220), possibly configuring at least two layers of the multilayered metrology target to comprise the interlaced lines with a same Moiré pitch p (stage 222) and optionally configuring at least another one layer of the multilayered metrology target to comprise a periodic structure with a pitch equal to the Moiré pitch p (stage 224). Method 200 may comprise carrying out scatterometry, imaging and/or critical dimension measurements using the metrology target (stage 230).

Method 200 may comprise configuring at least two cells at a single layer of the metrology target to comprise the interlaced lines, wherein at least some of the elements are mirrored in one of the cells with respect to the other of the cells (stage 240) and carrying out focus and dose measurements using the metrology target (stage 242).

Method 200 may comprise configuring at least two cells of the metrology target to comprise the interlaced lines, wherein in one of the cells, one of the interlaced lines comprises elements produced in consecutive steps (stage 250) and carrying out pitch walk measurements using the metrology target (stage 252).

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A metrology target comprising at least one cell comprising interlaced lines of elements, the interlaced lines having at least two different device-like pitches, $p_1$ and $p_2$, selected to yield at least one resolved Moiré pitch $p=p_1 \cdot p_2/(p_1-p_2)$, with $p_1$, $p_2 \leq 100$ nm and $p>400$ nm, wherein the metrology target further comprises at least two layers, one above another, having respectively $p_1$, $p_2$ with $p_A=p_1 \cdot p_2/(p_1-p_2)>400$ nm and $p_3$, $p_4$ with $p_B=p_3 \cdot p_4/(p_3-p_4)>400$ nm, with $p_A=p_B$.

2. The metrology target of claim 1, wherein the interlaced lines are alternating lines.

3. The metrology target of claim 1, wherein the interlaced lines are designed to yield a single compound line.

4. The metrology target of claim 1, wherein the interlaced lines are produced sequentially.

5. A target design file of the target of claim 1.

6. A method comprising interlacing lines of elements to produce a metrology target, the interlaced lines having at least two different device-like pitches, $p_1$ and $p_2$, selected to yield at least one resolved Moiré pitch $p=p_1 \cdot p_2/(p_1-p_2)$, with $p_1$, $p_2 \leq 100$ nm and $p>400$ nm, wherein the metrology target further comprises at least two layers, one above another, having respectively $p_1$, $p_2$ with $p_A=p_1 \cdot p_2/(p_1-p_2)>400$ nm and $p_3$, $p_4$ with $p_B=p_3 \cdot p_4/(p_3-p_4)>400$ nm, with $p_A=p_B$.

7. The method of claim 6, further comprising alternating the interlaced lines.

8. The method of claim 6, further comprising combining the interlaced lines into a single compound line.

9. The method of claim 6, further comprising producing the interlaced lines sequentially and carrying out double patterning measurements using the metrology target.

10. The method of claim 6, further comprising configuring at least one layer of a multilayered metrology target to comprise the interlaced lines and configuring at least two layers of the multilayered metrology target to comprise the interlaced lines with a same Moiré pitch p.

11. The method of claim 10, further comprising configuring at least another one layer of the multilayered metrology target to comprise a periodic structure with a pitch equal to the Moiré pitch p.

12. The method of claim 6, further comprising carrying out scatterometry, imaging and/or critical dimension measurements using the metrology target.

13. The method of claim 6, further comprising configuring at least two cells at a single layer of the metrology target to comprise the interlaced lines, wherein at least some of the elements are mirrored in one of the cells with respect to the other of the cells.

14. The method of claim 13, further comprising carrying out focus and dose measurements using the metrology target.

15. The method of claim 6, further comprising configuring at least two cells of the metrology target to comprise the interlaced lines, wherein in one of the cells, one of the interlaced lines comprises elements produced in consecutive steps.

16. The method of claim 15, further comprising carrying out pitch walk measurements using the metrology target.

* * * * *